(12) United States Patent
Shima et al.

(10) Patent No.: US 10,804,152 B2
(45) Date of Patent: Oct. 13, 2020

(54) METHOD OF MANUFACTURING SEMICONDUCTOR DEVICE

(71) Applicant: Toshiba Memory Corporation, Minato-ku, Tokyo (JP)

(72) Inventors: Masaya Shima, Yokkaichi Mie (JP); Ippei Kume, Yokkaichi Mie (JP); Eiichi Shin, Yokkaichi Mie (JP); Eiji Takano, Nagoya Aichi (JP); Takashi Shirono, Yokkaichi Mie (JP); Mika Fujii, Yokkaichi Mie (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/273,111

(22) Filed: Feb. 11, 2019

(65) Prior Publication Data

US 2019/0348324 A1 Nov. 14, 2019

(30) Foreign Application Priority Data

May 14, 2018 (JP) .................................. 2018-092900

(51) Int. Cl.
*H01L 21/768* (2006.01)
*H01L 21/3065* (2006.01)
*H01L 23/48* (2006.01)

(52) U.S. Cl.
CPC .... *H01L 21/76898* (2013.01); *H01L 21/3065* (2013.01); *H01L 23/481* (2013.01)

(58) Field of Classification Search
None
See application file for complete search history.

(56) References Cited

U.S. PATENT DOCUMENTS

| 5,479,138 A | 12/1995 | Kuroda et al. | |
|---|---|---|---|
| 2016/0020129 A1* | 1/2016 | Farrens | H01L 21/6835 428/201 |
| 2016/0126148 A1 | 5/2016 | Mauer et al. | |
| 2016/0133501 A1* | 5/2016 | Allen | H01L 21/6835 438/667 |

FOREIGN PATENT DOCUMENTS

| JP | 2006-114847 A | 4/2006 |
|---|---|---|
| JP | 2008-053308 A | 3/2008 |
| JP | 2002-009043 A | 1/2011 |
| JP | 2014-103140 A | 6/2014 |

* cited by examiner

*Primary Examiner* — Asok K Sarkar
(74) *Attorney, Agent, or Firm* — Foley & Lardner LLP

(57) ABSTRACT

According to one embodiment, a method of manufacturing a semiconductor device includes: bonding a first surface of a device substrate on which a device is formed on a first surface to a support substrate via an adhesive; after bonding the device substrate to the support substrate, grinding and thinning a second surface side opposite to the first surface of the device substrate based on an in-plane processing rate at the time of forming a semiconductor substrate by RIE; after thinning the device substrate, forming a hole penetrating the device substrate by RIE; and burying metal in the hole to forma through electrode.

7 Claims, 4 Drawing Sheets

METHOD OF MANUFACTURING SEMICONDUCTOR DEVICE

CROSS REFERENCE TO RELATED APPLICATION

This application is based upon and claims the benefit of priority from Japanese Patent Application No. 2018-092900, filed May 14, 2018, the entire contents of which are incorporated herein by reference.

FIELD

Embodiments described herein relate generally to a method of manufacturing a semiconductor device.

BACKGROUND

In a method of forming a through electrode in a semiconductor device, there is a method including bonding a support substrate to the surface of a device substrate on the side where a semiconductor device is formed, grinding and thinning the device substrate from the back side while the support substrate is being supported, and processing the device substrate by RIE (reactive ion etching) to form a hole for forming a through electrode. When forming a hole by processing a semiconductor substrate by RIE, the etching rate (processing rate) sometimes varies from region to region in the semiconductor device. If the etching rate varies from region to region, when the device substrate is processed more than necessary, the bottom of the hole is wider than an opening, whereas when the processing of the device substrate is insufficient, the bottom of the hole is narrower than the opening. When a through electrode (TSV, THROUGH SILICON VIA) having a different width in the depth direction is formed, the electric resistance is different as compared with a through electrode having a uniform width, which causes a device defect. For this reason, it is necessary to properly manage the width of the bottom of the hole. However, an in-plane tendency in the RIE process occurs between the central region and the outer peripheral region of a wafer. In order to reduce the influence of such an in-plane tendency and to improve the hole processing precision, there is a method of processing the substrate using the condition of a slow etching rate, which presents a problem that the productivity is lowered.

An example of related art includes JP-A-2006-114847.

DETAILED DESCRIPTION

Embodiments provide a method of manufacturing a semiconductor device capable of reducing defects of a through electrode.

In general, according to one embodiment, a method of manufacturing a semiconductor device includes: bonding a first surface of a device substrate on which a device is formed on a first surface to a support substrate via an adhesive; after bonding the device substrate to the support substrate, grinding and thinning a second surface side opposite to the first surface of the device substrate based on an in-plane processing rate at the time of forming a semiconductor substrate by RIE; after thinning the device substrate, forming a hole penetrating the device substrate by RIE; and burying metal in the hole to form a through electrode.

Hereinafter, a method of manufacturing a semiconductor device according to embodiments will be described in detail with reference to the accompanying drawings. It is noted that the present disclosure is not limited by these embodiments.

First Embodiment

Figure 1A:
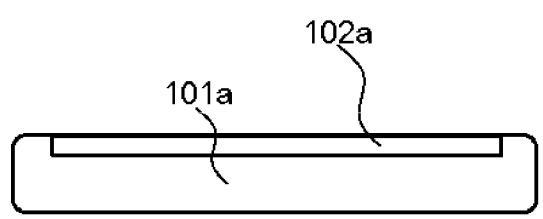
FIGS. 1A to 1D are explanatory cross-sectional views illustrating a manufacturing process of a semiconductor device according to a first embodiment.

FIGS. 1A to 1D are explanatory cross-sectional views illustrating a manufacturing process of a semiconductor device according to a first embodiment. As shown in FIG. 1A, a device substrate 101a having a plurality of semiconductor devices 102a on the front surface (first surface) side is prepared. The plurality of semiconductor devices 102a are, for example, semiconductor memory chips having a NAND type EEPROM (ELECTRICALLY ERASABLE AND PROGRAMMABLE READ-ONLY MEMORY) and the like. The device substrate 10 is, for example, a silicon wafer having a substantially disk shape.

Figure 1B:
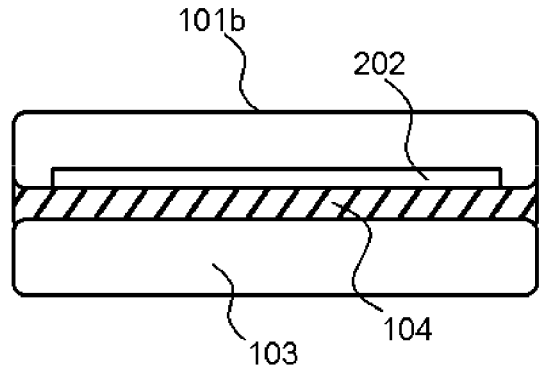

Thereafter, as shown in FIG. 1B, the front surface side of the device substrate 101a is bonded to a support substrate 103 via a first adhesive 104. Thereby, the back surface of the device substrate 101a can be processed satisfactorily in the process of grinding the device substrate 101a described later. For example, glass, silicon or the like is used for the support substrate 103, and the support substrate 103 is a disk-shaped substrate having substantially the same diameter and thickness as those of the device substrate 10. It is noted that the material and shape including the diameter and thickness of the support substrate 103 are not limited thereto.

Figure 1C:
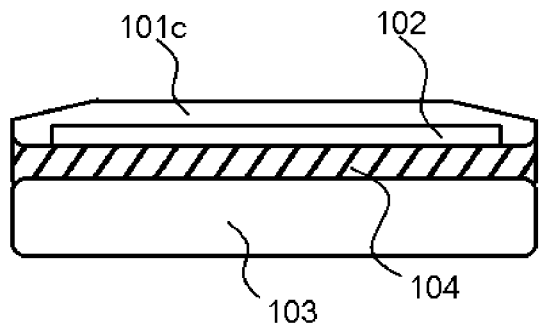

Subsequently, as shown in FIG. 1C, the device substrate 101a is ground and thinned from the back surface (second surface) 101b side by using a grinder based on the in-plane etching rate of RIE of the device substrate 101a described later. The thinned substrate is labeled as a device substrate 101c. In the embodiment, the thickness of the central region of the device substrate 101c is thicker than the thickness of the outer peripheral region of the device substrate 101c, for example. Further, the outer peripheral region of the device substrate 101c is inclined inward. Since the device substrate (Si) is isotropically etched by a RIE process described later, in order to keep the diameter variation of bottoms of holes at 2 μm or less, it is necessary to keep the thickness of the device substrate (Si) at ±2 μm or less of the desired thickness and perform thinning.

Figure 1D:
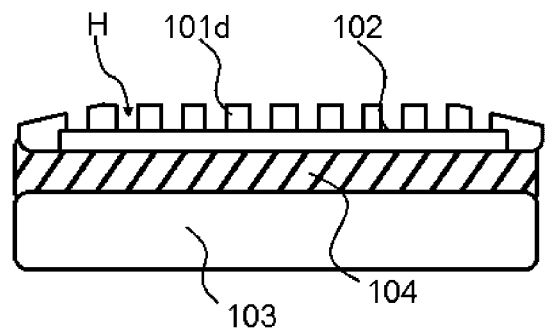

Subsequently, as shown in FIG. 1D, the back surface side of the device substrate 101c is processed by RIE to form a plurality of holes H. The plurality of holes H are holes passing through the device substrate 101c. The processed substrate is labeled as a device substrate 101d. In FIG. 1D, the processing rate of RIE for each region of the device substrate 101c is, for example, large in the central region of the device substrate 101c and small in the outer peripheral region of the device substrate 101c. Thereafter, a plurality of holes are filled with metal to form a plurality of through electrodes (not shown). The device substrate 101d having the through electrodes formed thereon is peeled off from the support substrate 103 to divide the device substrate 101d into individual pieces. A plurality of individual device substrates 101d are stacked to form a semiconductor chip.

Figure 2:
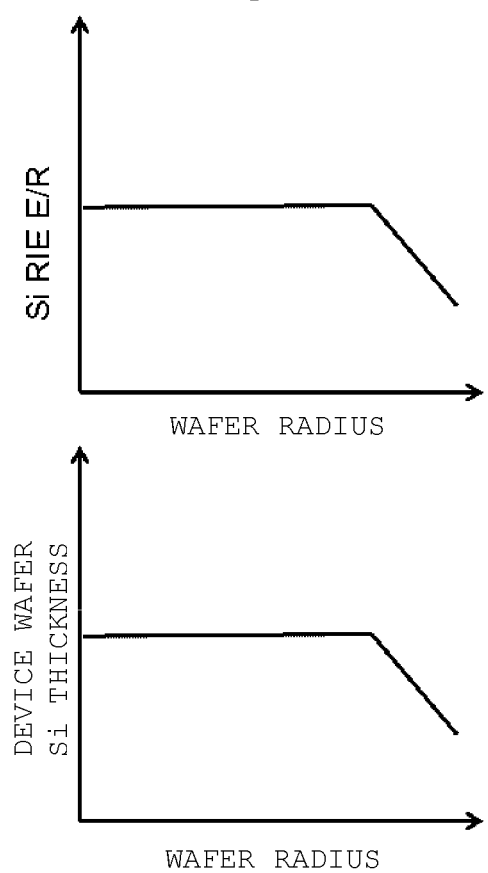
FIG. 2 is a view for explaining an in-plane etching rate of RIE according to the embodiment.

FIG. 2 is a diagram for explaining the in-plane etching rate of RIE of the device substrate according to the first embodiment. In FIG. 2, the horizontal axis shows the distance from the center of the device substrate, and the vertical axis shows the processing rate when processed by RIE. In the embodiment, the processing rate by RIE is large in the central region of the device substrate 101a, and small in the outer peripheral region, and further decreases as it is spaced away from the central region in the outer peripheral region. Therefore, if it is attempted to process a device substrate of uniform thickness by RIE, the device substrate 101 may be excessively processed, or the device substrate 101a may not be processed sufficiently. When the device substrate 101a is excessively processed, the diameter of the bottom of a hole is large. After the hole is formed, a barrier metal containing metal such as Ti is formed in the hole by PVD or the like, but a barrier metal having a sufficient film thickness is hardly formed at the bottom of the hole. Thus, an open failure occurs due to inhibition of plating growth when a through electrode is formed in the hole. In addition, a leak failure occurs due to diffusion of metal such as Cu contained in the through electrode into the semiconductor substrate due to insufficient barrier property. When the processing of the device substrate 101a is not sufficient, an open failure occurs.

In the embodiment, the back surface of the device substrate 101c is ground and thinned so that the thickness of the outer peripheral region is thinner than the thickness of the central region based on the in-plane etching rate (processing rate) by RIE of the device substrate 101c. Thereby, it is possible to prevent the device substrate from being processed more than necessary, and the device substrate from being not processed sufficiently. As a result, it is possible to reduce holes H having different diameters for each depth from being formed. That is, it is possible to forma plurality of through electrodes having a uniform diameter. It is noted that, in the embodiment, a device substrate 101a prepared separately in advance may be processed by RIE, and the etching rate for each region may be estimated from the measurement result obtained by measuring the device substrate after processing.

Second Embodiment

Figure 3A:
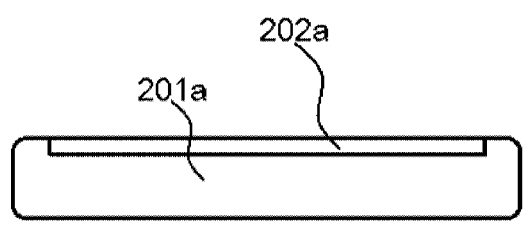
FIGS. 3A to 3D are explanatory cross-sectional views of a manufacturing process of a semiconductor device according to a second embodiment.

As shown in FIG. 3A, a device substrate 201a having a plurality of semiconductor devices 202a on the front surface side is prepared. Although in the first embodiment, the device substrate 101a and the support substrate 103 are bonded to each other via the first adhesive 104 having a uniform thickness, in the second embodiment, the thickness of a second adhesive 204 is controlled based on the in-plane etching rate (processing rate) of RIE. As a result, the device substrate 201a formed on the second adhesive 204 is bonded to the support substrate 203 with the device substrate 201a warped downward. Other configurations of the second embodiment may be the same as corresponding configurations of the first embodiment.

Figure 3B:
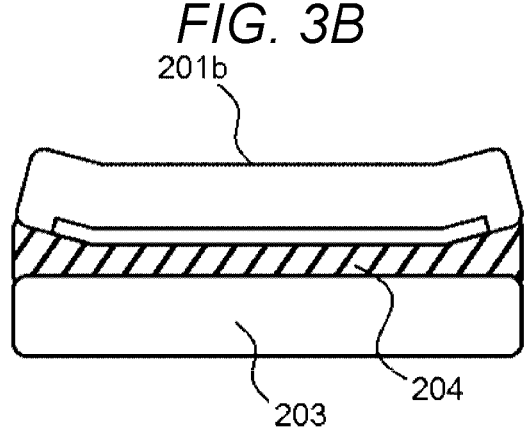

Thereafter, as shown in FIG. 3B, the front surface side of the device substrate 201a is bonded to the support substrate 203 via the second adhesive 204. At this time, the thickness of the second adhesive 204 is controlled based on the in-plane etching rate (processing rate) of RIE as shown in FIG. 2, for example. For example, the thickness of the outer peripheral region of the second adhesive 204 is thicker than the thickness of the central region. As a result, the device substrate 201a is bonded to the support substrate 203 with the device substrate 201a warped downward via the adhesive 204.

Figure 3C:
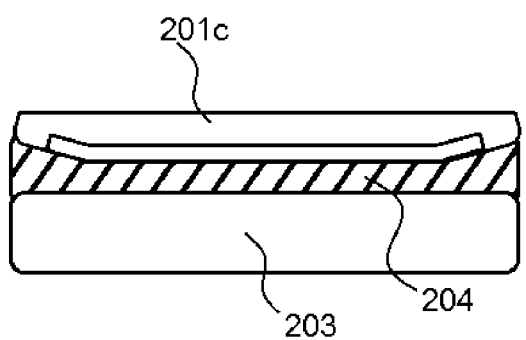
Figure 3D:
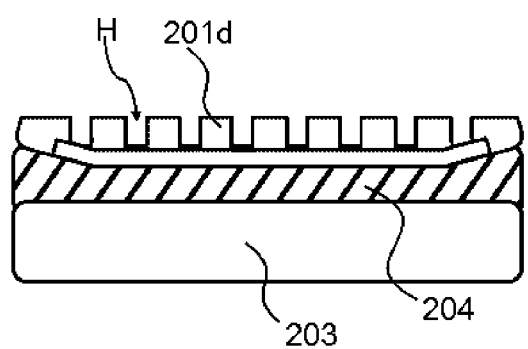

Thereafter, as shown in FIG. 3C, the device substrate 201a is processed and thinned by a grinder so as to be flat from the back surface 201b side. The thinned device substrate is labeled as a device substrate 201c. Thereafter, as shown in FIG. 3D, the device substrate 201c is processed by RIE, and a plurality of holes H are formed on the back surface side to forma device substrate 201d. Thereafter, a plurality of holes H are filled with metal to form a plurality of through electrodes (not shown). The device substrate 201d having the through electrodes formed thereon is peeled off from the support substrate 203 to divide the device substrate 201d into individual pieces. A plurality of individual device substrates 201d are stacked to form a semiconductor chip.

In the embodiment, by controlling the thickness of the first adhesive 204 based on the in-plane etching rate (processing rate) of RIE, it is possible to obtain the device substrate 201c having a desired thickness for each region when grinding and thinning by a grinder. Thus, it is possible to prevent the device substrate 201a from being processed more than necessary, and the device substrate 201a from being not processed sufficiently when the holes are formed by RIE. As a result, it is possible to reduce holes H having different diameters for each depth from being formed. That is, it is possible to form a plurality of through electrodes having a uniform diameter.

Third Embodiment

Figure 4A:
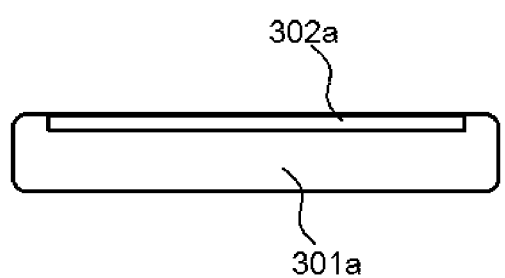
FIGS. 4A to 4D are explanatory cross-sectional views of a manufacturing process of a semiconductor device according to a third embodiment.

Although in the second embodiment, the device substrate is bonded to the support substrate 203 using the second adhesive 204, in the third embodiment, an adhesive having a multilayer structure is formed using a plurality of adhesives. Other configurations of the third embodiment may be the same as corresponding configurations of the first embodiment. As shown in FIG. 4A, a device substrate 301a having a plurality of semiconductor devices 302a on the front surface side is prepared.

Figure 4B:
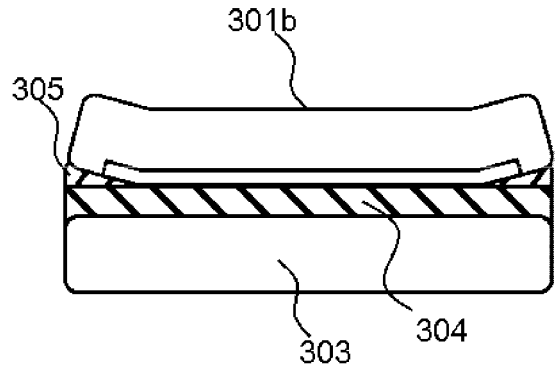

Thereafter, as shown in FIG. 4B, the front surface side of the device substrate 301a is bonded to a support substrate 303 via a plurality of second adhesives. A third adhesive 304 is applied to the entire surface of the support substrate 303, and a fourth adhesive 305 is applied to the outer peripheral region of the third adhesive 304. At this time, the combined thickness of the third adhesive 304 and the fourth adhesive 305 is controlled based on the in-plane etching rate (processing rate) of RIE for each region as shown in FIG. 2, for example. Thereafter, the device substrate 301a is bonded to the support substrate 203 via the third adhesive 304 and the fourth adhesive 305. At this time, the device substrate 301a is warped by the thickness of the second adhesive 305.

Figure 4C:
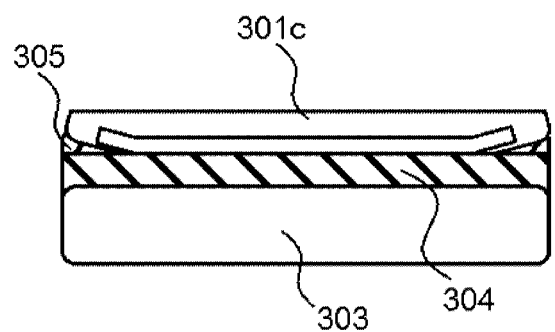
Figure 4D:
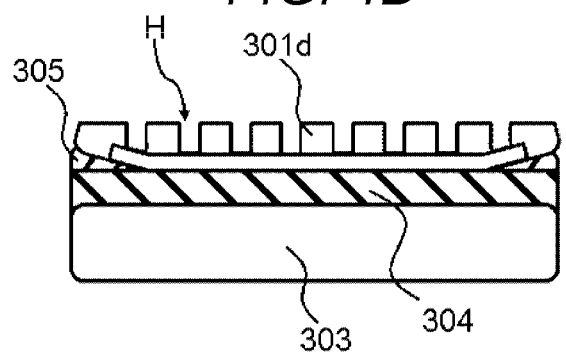

Thereafter, as shown in FIG. 4C, the device substrate 301a is ground and thinned by a grinder so as to be flat from the back surface 301b side. The thinned device substrate is labeled as a device substrate 301c. Subsequently, as shown in FIG. 4D, the device substrate 301c is processed by RIE to obtain a device substrate 301d having a plurality of holes H formed on the back surface side. Thereafter, a plurality of holes are filled with metal to form a plurality of through electrodes (not shown). The device substrate 301d having the through electrodes formed thereon is peeled off from the support substrate 303 to divide the device substrate 301d into individual pieces. A plurality of individual device substrates 301*d* are stacked to form a semiconductor chip.

In the embodiment, since the thickness of the stacked adhesive is controlled based on the in-plane etching rate (processing rate) of RIE for each region, when the device substrate 301*a* is processed and flattened from the back surface 301*b* side, and the resulting device substrate 301*c* is processed to form holes, it is possible to prevent the device substrate 301*c* from being processed more than necessary, and the device substrate 301*c* from being not processed sufficiently. As a result, it is possible to reduce holes H having different diameters for each depth from being formed. That is, it is possible to form a plurality of through electrodes having a uniform diameter. It is noted that, although in the embodiment, the adhesive thickness is controlled by combining the third adhesive 304 formed on the entire surface and the fourth adhesive 305 partially formed, in order to obtain the device substrate 301*d* having a desired thickness, the fourth adhesive 305 may be formed on the inner periphery as necessary. Further, the adhesive thickness may be controlled by stacking three or more adhesives. Further, when the third adhesive 304 can adequately bond the support substrate 303 and the device substrate 301*a*, the fourth adhesive 305 may be a material having only a thickness control function without having a bonding function.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
    processing a second device substrate by reactive ion etching;
    measuring the second device substrate to obtain an in-plane processing rate for each region of the second device substrate;
    bonding a first surface of a first device substrate on which a device is formed on a first surface to a support substrate via an adhesive;
    after bonding the first device substrate to the support substrate, grinding and thinning a second surface opposite to the first surface of the first device substrate based on the in-plane processing rate measured for each region of the second device substrate, wherein when an in-plane processing rate used in a first region of the first device substrate is faster than an in-plane processing rate of a second region of the first device substrate, a first thickness of the first region of the first device substrate is thicker than a second thickness of the second region of the first device substrate;
    after thinning the first device substrate, forming a hole penetrating the first device substrate by RIE; and
    burying metal in the hole to form a through electrode.

2. The method of manufacturing a semiconductor device according to claim 1, wherein the first region is a central region of the first device substrate and the second region is an outer peripheral region of the first device substrate.

3. The method of manufacturing a semiconductor device according to claim 1, wherein in the forming of the hole, the in-plane processing rate in the second region of the first device substrate is smaller than the in-plane processing rate in the first region.

4. A method of manufacturing a semiconductor device, comprising:
    processing a second device substrate by reactive ion etching (RIE);
    measuring the second device substrate to obtain an in-plane processing rate for each region of the second device substrate;
    bonding a first surface of a first device substrate on which a device is formed on a first surface to a support substrate via an adhesive based on the in-plane processing rate measured for each region of the second device substrate, wherein when an in-plane processing rate of a first region of the first device substrate is faster than an in-plane processing rate of a second region of the first device substrate, a first total thickness of the first region of the first device substrate, the support substrate, and the adhesive is thinner than a second total thickness of the second region of the first device substrate, the support substrate, and the adhesive;
    after bonding the first device substrate to the support substrate, grinding and thinning a second surface side opposite to the first surface, wherein a first thickness of the first region of the first substrate is thicker than a second thickness of the second region of the first substrate;
    after thinning the first device substrate, forming a hole penetrating the first device substrate by RIE; and
    burying metal in the hole to form a through electrode.

5. The method of manufacturing a semiconductor device according to claim 4, wherein
    in the bonding, the adhesive includes a first adhesive and a second adhesive,
    the first adhesive is provided on the entire surface of the first surface of the first device substrate, and
    the second adhesive is partially provided on the first adhesive.

6. The method of manufacturing a semiconductor device according to claim 5, wherein the second adhesive provided an outer peripheral region of the first device substrate.

7. The method of manufacturing a semiconductor device according to claim 4, wherein the first region is a central region of the first device substrate and the second region is an outer peripheral region of the first device substrate.

* * * * *